(12) United States Patent
Uchino et al.

(10) Patent No.: US 7,895,736 B2
(45) Date of Patent: Mar. 1, 2011

(54) METHOD AND APPARATUS FOR ELECTRONIC COMPONENT MOUNTING

(75) Inventors: Takashi Uchino, Fukuoka (JP); Tadashi Shinozaki, Fukuoka (JP); Norifumi Eguchi, Saga (JP); Naoki Yamauchi, Fukuoka (JP); Masao Hidaka, Fukuoka (JP); Toru Nakazono, Fukuoka (JP)

(73) Assignee: Panasonic Corporation, Osaka (JP)

( * ) Notice: Subject to any disclaimer, the term of this patent is extended or adjusted under 35 U.S.C. 154(b) by 270 days.

(21) Appl. No.: 12/293,646

(22) PCT Filed: Mar. 12, 2007

(86) PCT No.: PCT/JP2007/054857

§ 371 (c)(1),
(2), (4) Date: Sep. 19, 2008

(87) PCT Pub. No.: WO2007/108352

PCT Pub. Date: Sep. 27, 2007

(65) Prior Publication Data

US 2010/0229378 A1 Sep. 16, 2010

(30) Foreign Application Priority Data

Mar. 22, 2006 (JP) ............................. 2006-078447

(51) Int. Cl.
*B23P 19/00* (2006.01)
(52) U.S. Cl. ............................. 29/740; 29/739; 29/741; 29/832; 29/833
(58) Field of Classification Search .................. 29/720, 29/739, 740, 741, 832, 833
See application file for complete search history.

(56) References Cited

U.S. PATENT DOCUMENTS 5,839,186 A * 11/1998 Onodera ...................... 29/720

(Continued)

FOREIGN PATENT DOCUMENTS

JP  2003-008293  1/2003

(Continued)

OTHER PUBLICATIONS

International Search Report for PCT/JP2007/054857; completed Apr. 4, 2007.

*Primary Examiner*—C. J Arbes
(74) *Attorney, Agent, or Firm*—Pearne & Gordon LLP

(57) ABSTRACT

A challenge to be met by the present invention is to provide an electronic component mounting apparatus and an electronic component mounting method that enable a reduction in the frequency of operation required with switching of a component type, to thus enhance productivity.

In component mount operation for taking chips of component types A, B, and C out of a component supply portion by means of a single mount head and mounting the chips on two substrates held by a first lane and a second lane, when a subsequently-carried-in subsequent substrate has come to be able to undergo component mount operation before completion of processing pertaining to a preceding substrate mount process in which component mount operation is carried out on a previously-carried-in preceding substrate among a plurality of substrates, processing pertaining to a subsequent substrate mount process is started by taking, as mount start components, chips already serving as targets of component mount operation for the preceding substrate at this timing, and processing pertaining to the preceding substrate mount process during which mounting is not yet completed is continually carried out. Thereby, the frequency of operation required with switching of a component type, such as replacement of a nozzle, can be reduced.

4 Claims, 12 Drawing Sheets

U.S. PATENT DOCUMENTS

| | | | |
|---|---|---|---|
| 6,606,790 B2 * | 8/2003 | Hidese | 29/832 |
| 6,744,499 B2 * | 6/2004 | Skunes et al. | 356/243.1 |
| 7,003,872 B2 * | 2/2006 | Mimura et al. | 29/832 |
| 7,251,541 B2 * | 7/2007 | Shimizu | 700/121 |
| 7,752,748 B2 * | 7/2010 | Yamasaki et al. | 29/833 |
| 2006/0053624 A1 * | 3/2006 | Maeda et al. | 29/832 |
| 2009/0119904 A1 * | 5/2009 | Yamasaki et al. | 29/593 |

FOREIGN PATENT DOCUMENTS

| | | |
|---|---|---|
| JP | 2005-129754 | 5/2005 |
| WO | 2004-066702 | 8/2004 |

* cited by examiner

| | | |
|---|---|---|
| 2 COMPONENT SUPPLY PORTION | 10 SUBSTRATE HOLD PORTION | 14 SUBSTRATE CARRY-OUT CONVEYOR |
| 5 WAFER RING | 11 SUBSTRATE | 17 WAFER SUPPLY PORTION |
| 6 CHIP | 12 SUBSTRATE CARRY-IN CONVEYOR | 33 MOUNT HEAD |

METHOD AND APPARATUS FOR ELECTRONIC COMPONENT MOUNTING

TECHNICAL FIELD

The present invention relates to an electronic component mounting apparatus and an electronic component mounting method for mounting electronic components, such as a semiconductor wafer, on a substrate.

BACKGROUND ART

An electronic component mounting apparatus for mounting electronic components, such as semiconductor chips, on a substrate has a part supply portion for supplying electronic components and a substrate hold portion for positioning and holding a substrate. Component mount operation is performed by taking electronic components by a mount head and through use of a nozzle and carrying and mounting the component on a substrate positioned by the substrate hold portion. A known mounting apparatus is configured so as to have a plurality of substrate hold portions with a view toward enhancing productivity of component mount operation (see; for instance, Patent Document 1).

In the Patent Document, a substrate hold portion serving as amount stage where a loading head performs operation for mounting components is provided in two rows, and two substrates held by the substrate hold portions are sequentially subjected to mount operation. As a result, in the middle of one substrate being subjected to mount operation, carrying in and out of the other substrate can be simultaneously performed and in parallel with the mount operation. There is yielded an advantage of the ability to enhance efficiency of the mount operation by elimination of a useless standby time of the mount head.

Patent Document 1: JP-A-2005-129754

DISCLOSURE OF THE INVENTION

Problem that the Invention is to Solve

Incidentally, the type of an electronic component mounted on one substrate is not limited to one, and there is a case where mounting a plurality of types of electronic components is sought in one process for mounting a component. In such a case, housing a plurality of types of electronic components in a component supply portion and provision of a nozzle replacement mechanism for replacing a nozzle to be attached to the mount head to another nozzle conforming to an electronic component to be mounted are sought. Every time an electronic component to be mounted is switched during mount operation, nozzle replacement operation for replacing a nozzle of the mount head must be performed.

The nozzle replacement operation is for moving a mount head to a nozzle housing portion where a plurality of types of nozzles are housed in advance, where the mount head is subjected to operation for detaching and attaching nozzles, and mount operation is unavoidably interrupted in the interim. The component supply portion also requires operation for switching types of components to be supplied. When substrates of types requiring replacement of nozzles and switching of components are taken as objects for mount operation of a mounting apparatus, such as that described in connection with the previously-described example of the related art, replacement of nozzles and switching of types of components must be iteratively performed at high frequency for each implementing operation intended for an individual substrate, which leads to an increase in a period of interruption of mount operation, to thus obstruct enhancement of productivity.

Accordingly, the present invention aims at providing an electronic component mounting apparatus and an electronic component mounting method that enable enhancement of productivity by reducing the frequency of operation required to be performed in connection with switching of types of components.

Device for Solving the Problem

An electronic component mounting apparatus of the present invention is directed toward an electronic component mounting apparatus that takes electronic components out of a component supply portion that supplies a plurality of types of electronic components, by a nozzle removably attached to a single mount head, and that conveys and mounts the electronic components on a plurality of substrates, the apparatus comprising:

substrate hold portions for individually positioning and holding the plurality of substrates, a substrate conveyance mechanism for sequentially carrying the plurality of substrates into the substrate hold portions and sequentially carrying mounted substrates out of the substrate hold portions, a mount enable/disable determination device for determining whether or not component mount operation targeted for the substrates can be carried out by individually detecting states of the substrates in the substrate hold portion, a head movement mechanism for moving the single mount head between the component supply portion and the substrate hold portions, and a nozzle replacement mechanism for removably attaching to the mount head the nozzle conforming to the respective electronic components of a plurality of types; and a mount control device that controls the substrate hold portions, the substrate conveyance mechanism, the head movement mechanism, and the nozzle replacement mechanism on the basis of a result of determination made by the mount enable/disable determination device, thereby carrying out component mount operation for causing the mount head to sequentially mount the electronic components of the plurality of types to the plurality of substrates that are held by the substrate hold portions and that have come to be able to undergo component mount operation while replacing the nozzle in conformance to a type of electronic components to be mounted, wherein, when, among the plurality of substrates, a subsequent substrate carried in the substrate hold portion subsequently to a preceding substrate has come to be able to undergo component mount operation before completion of processing pertaining to a preceding substrate mount process in which the component mount operation is carried out on, among the plurality of substrates, the preceding substrate previously carried into the substrate hold portion, the mount control device takes the subsequent substrate as a target while taking electronic components already serving as targets of component mount operation for the preceding substrate at the timing as mount start components for the subsequent substrate.

An electronic component mounting method of the present invention is directed toward an electronic component mounting method for taking electronic components out of a component supply portion that supplies a plurality of types of electronic components, by a nozzle removably attached to a single mount head, and conveying and mounting the electronic components on a plurality of substrates held by substrate hold portions, the method comprising:

carrying out component mount operation for sequentially mounting, by the mount head, the plurality of types of electronic components to a plurality of substrates that are held by the substrate hold portions and that have come to be able to undergo component mount operation, while replacing the nozzle in conformance to a type of electronic components to be mounted, wherein, when, among the plurality of substrates, a subsequent substrate carried in the substrate hold portion subsequently to the preceding substrate has come to be able to undergo component mount operation before completion of processing pertaining to a preceding substrate mount process in which component mount operation is carried out, on among the plurality of substrates, a preceding substrate previously carried into the substrate hold portion, electronic components that are already targets of component mount operation for the preceding substrate at the timing are taken as mount start components for the subsequent substrate.

ADVANTAGE OF THE INVENTION

According to the present invention, in a preceding substrate mount process for subjecting among a plurality of substrates a preceding substrate previously carried in a substrate hold portion to component mount operation, when a subsequent substrate carried in subsequently to a preceding substrate enters a state where the subsequent substrate can undergo component mount operation before completion of the preceding substrate mount process, electronic components serving as objects to be mounted on the preceding substrate at this timing are taken as mount start components for the subsequent substrate, thereby reducing the frequency of operation required to perform in conjunction with switching of a type of component, such as replacement of a nozzle, to thus enhance productivity.

DESCRIPTIONS OF THE REFERENCE NUMERALS

2 COMPONENT SUPPLY PORTION
3 WAFER HOLD TABLE
5 WAFER RING
6 CHIP
10 SUBSTRATE HOLD PORTION
11 SUBSTRATE
12 SUBSTRATE CARRY-IN CONVEYOR
14 SUBSTRATE CARRY-OUT CONVEYOR
17 WAFER SUPPLY PORTION
33 MOUNT HEAD
54 CONTROL PORTION (MOUNT CONTROL DEVICE)
54a MOUNT ENABLE/DISABLE DETERMINATION PORTION (MOUNT ENABLE/DISABLE DETERMINATION DEVICE)

BEST MODE FOR IMPLEMENTING THE INVENTION

Figure 1:
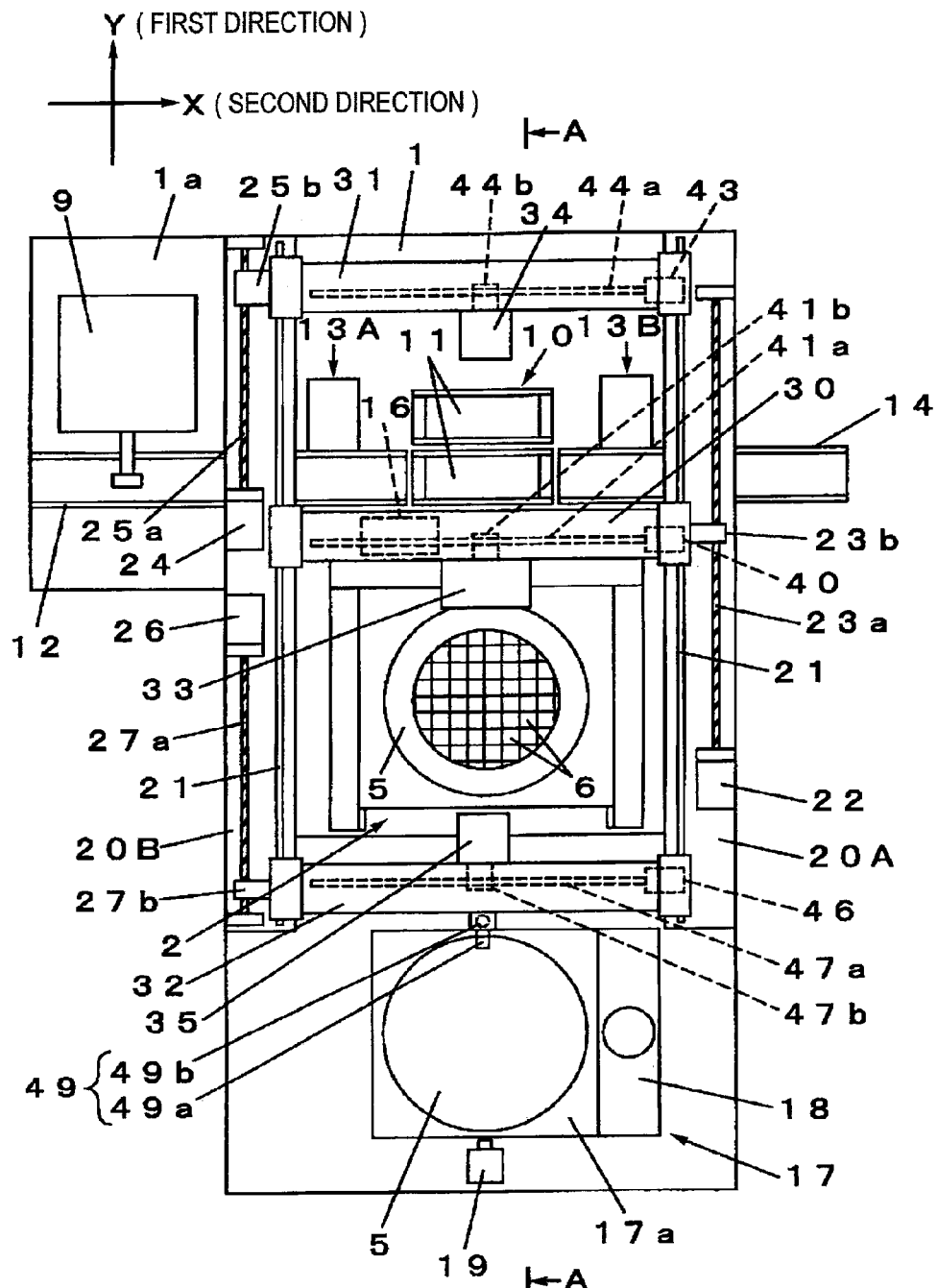
FIG. 1 is a plan view of an electronic component mounting apparatus of an embodiment of the present invention.
Figure 2:
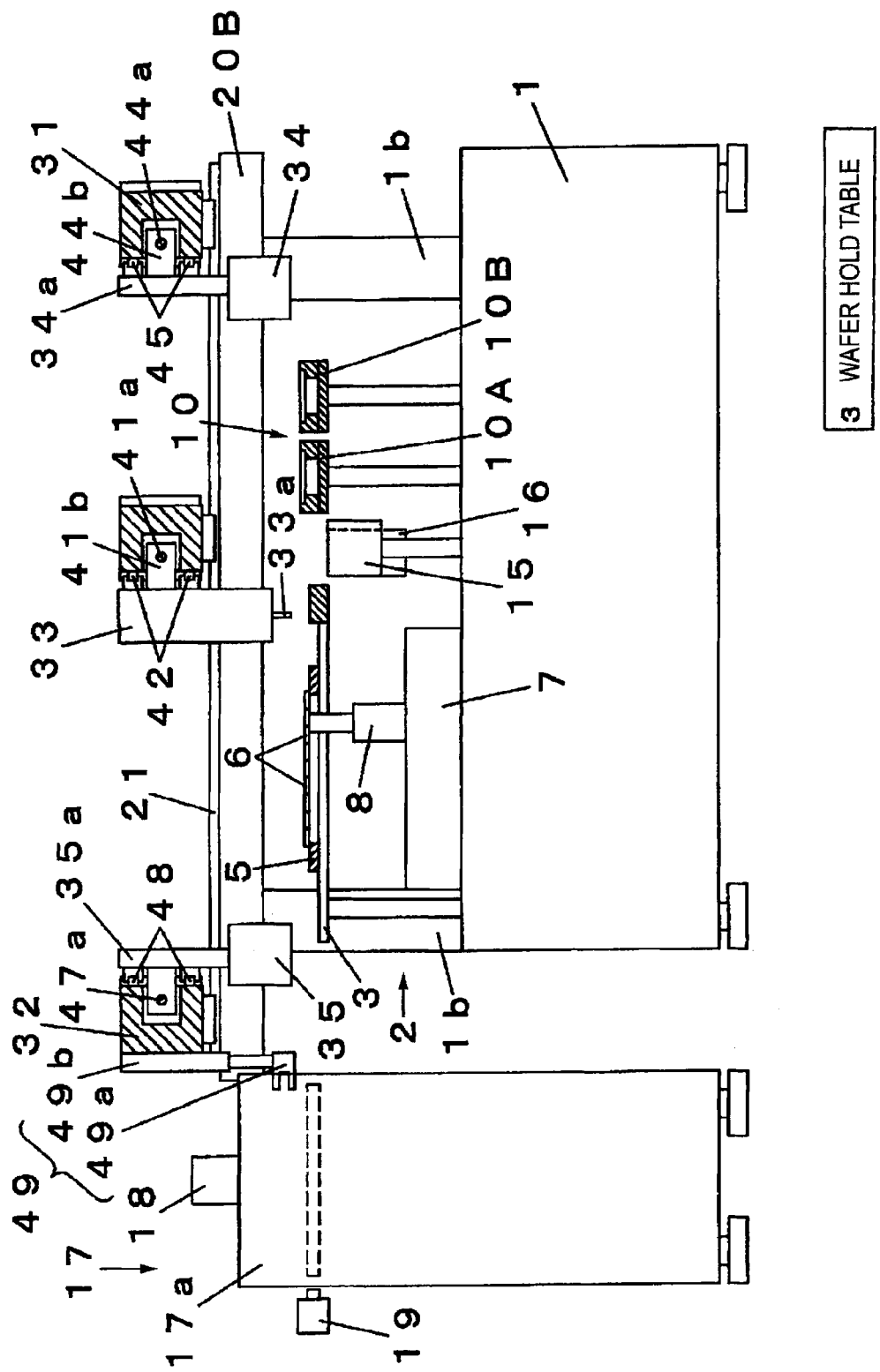
FIG. 2 is a side cross-sectional view of the electronic component mounting apparatus of the embodiment of the present invention.
Figure 3:
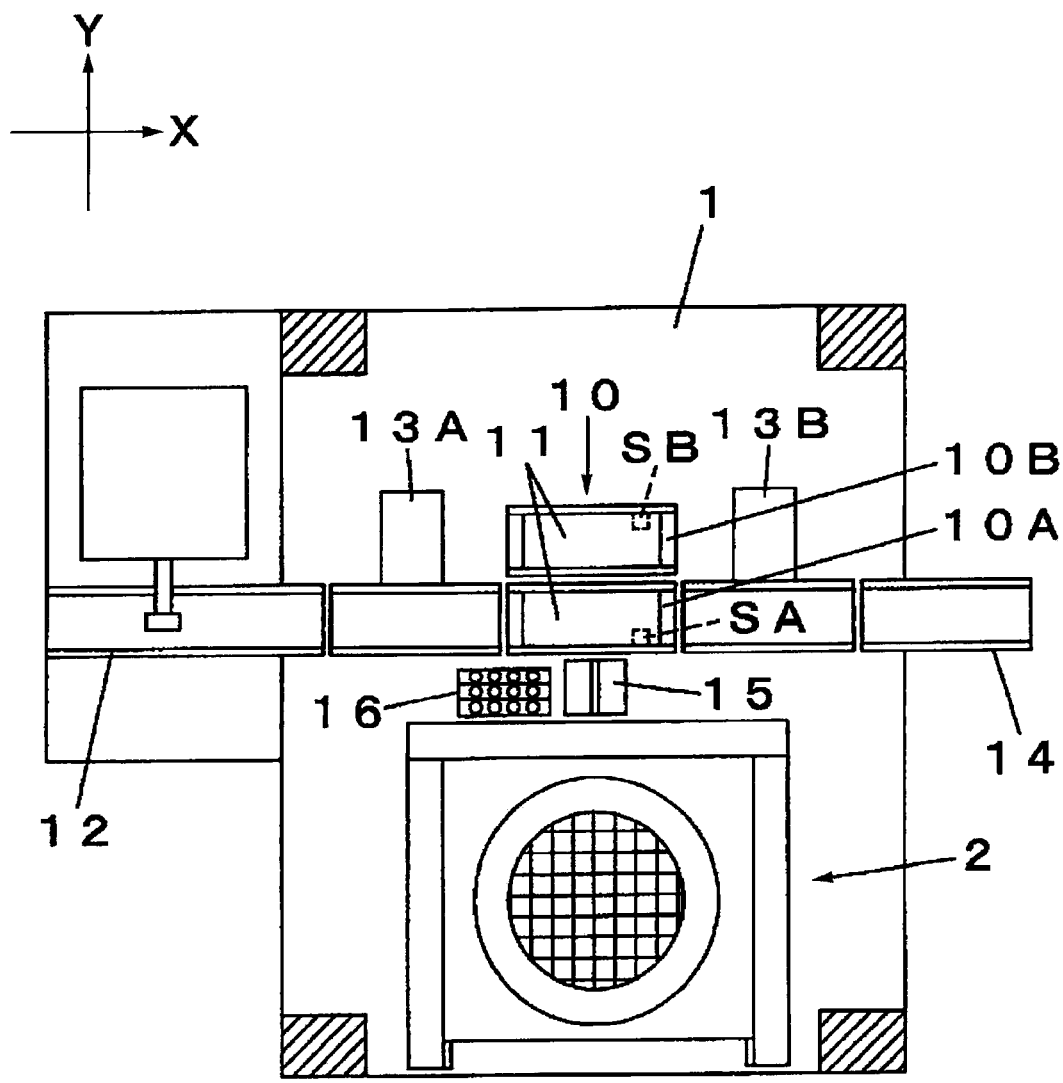
FIG. 3 is a partial plan view of the electronic component mounting apparatus of the embodiment of the present invention.
Figure 4:
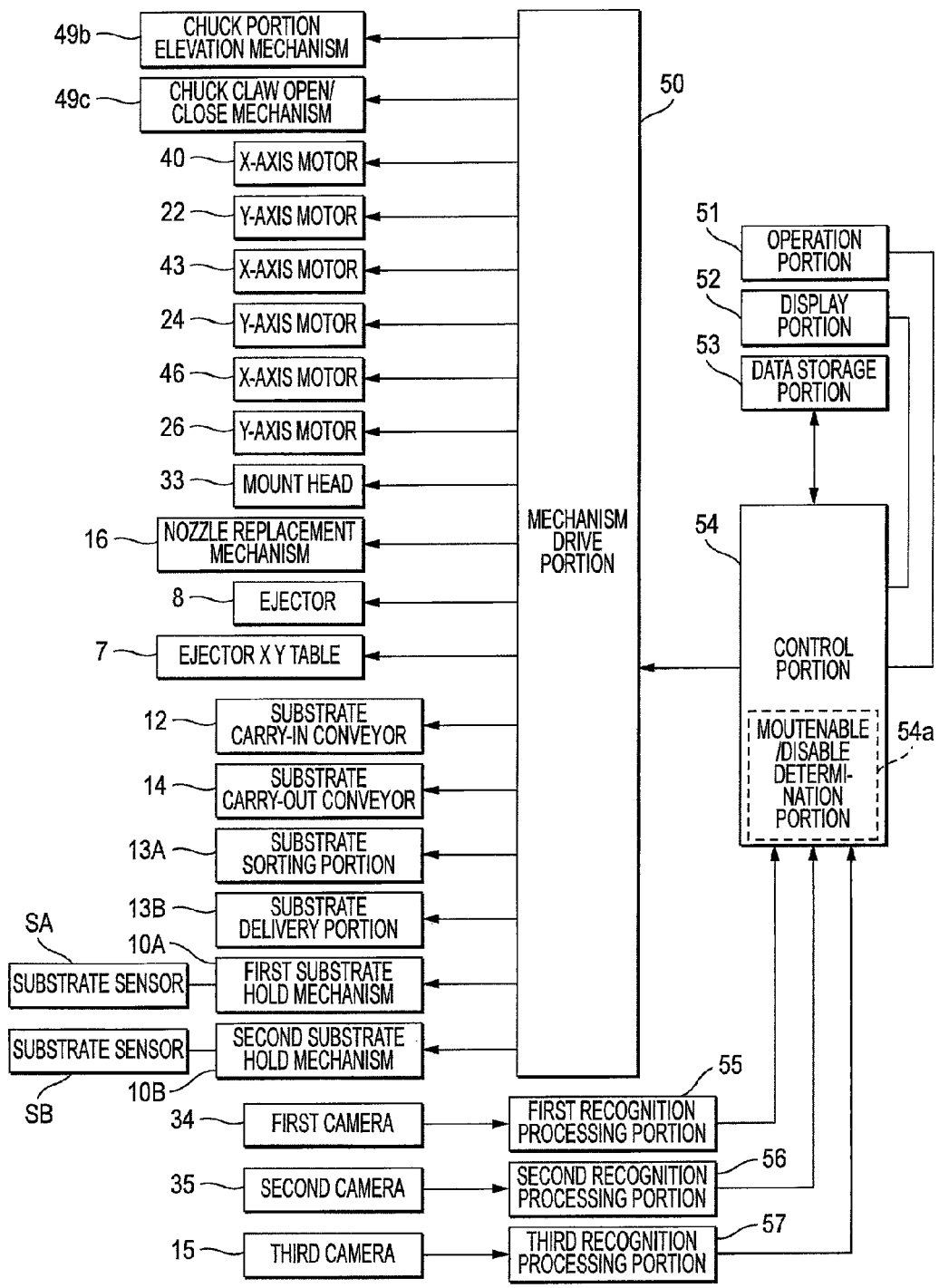
FIG. 4 is a block diagram showing the configuration of a control system of the electronic component mounting apparatus of the embodiment of the present invention.
Figure 8:
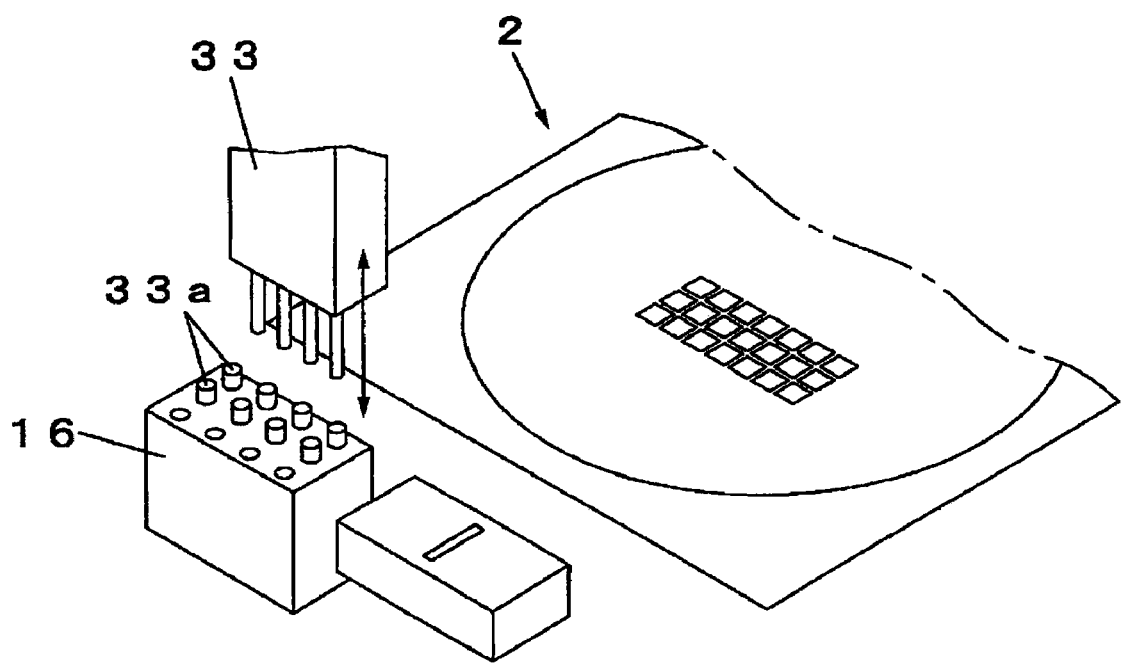
FIG. 8 is an explanatory view of operation of the electronic component mounting apparatus of the embodiment of the present invention.
Figure 9:
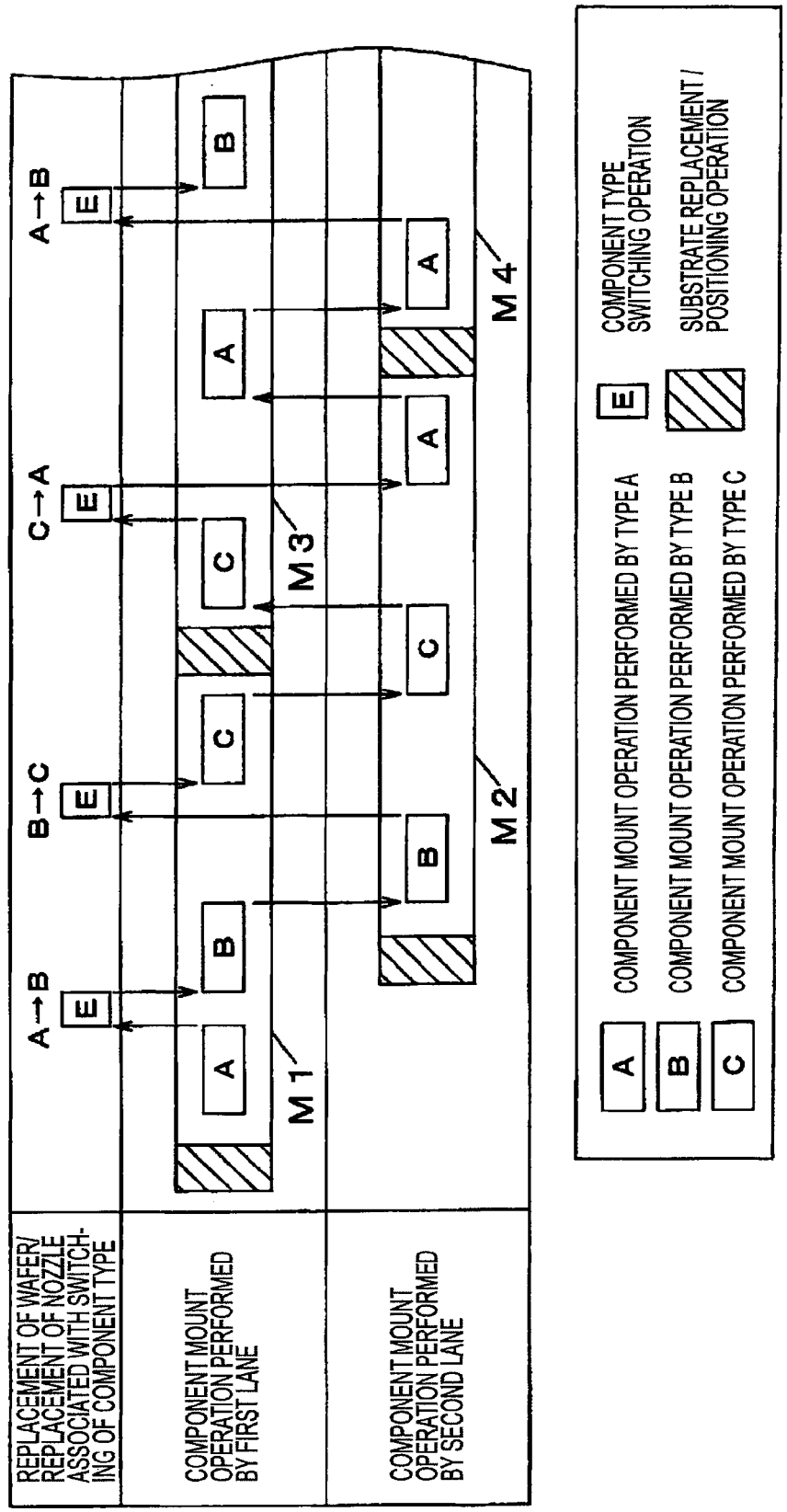
FIG. 9 is a timing chart showing the sequence of performance of component mount operation for an electronic component mount method of an embodiment of the present invention.

An embodiment of the present invention will now be described by reference to the drawings. FIG. 1 is a plan view of an electronic component mounting apparatus of an embodiment of the present invention; FIG. 2 is a side cross-sectional view of the electronic component mounting apparatus of the embodiment of the present invention; FIG. 3 is a partial plan view of the electronic component mounting apparatus of the embodiment of the present invention; FIG. 4 is a block diagram showing the configuration of a control system of the electronic component mounting apparatus of the embodiment of the present invention; FIGS. 5A, 5B, 6A, 6B 7A, 7B and 8 are explanatory views of operation of the electronic component mounting apparatus of the embodiment of the present invention; FIG. 9 is a timing chart showing the sequence of performance of component mount operation for an electronic component mount method of an embodiment of the present invention; and FIGS. 10A to 10C, 11A to 11C, and 12A to 12C are explanatory views of processes of the electronic component mounting method of the embodiment of the present invention.

First, the entire structure of the electronic component mounting apparatus will be described by reference to FIGS. 1, 2, and 3. FIG. 2 shows a view of the apparatus when viewed from A-A shown in FIG. 1. In FIG. 1, a component supply portion 2 is disposed on a base 1. As shown in FIG. 2, the component supply portion 2 has a wafer hold table 3, and the wafer hold table 3 removably holds a wafer ring 5 that is a component hold jig. Semiconductor chips 6 (hereinafter abbreviated simply as "chips 6") corresponding to electronic components are affixed in a state of being separated into pieces to a sheet (omitted from the drawings) stretched on a wafer ring 5. In a state where the wafer ring 5 is held on the wafer hold table 3, the component supply portion 2 supplies the chips 6 that are two-dimensionally arranged in numbers and held on the component hold jig.

As shown in FIG. 2, an ejector 8 is arranged, below the wafer ring 5 held by the wafer hold table 3, by an ejector XY table 7 so as to be movable in a horizontal direction. The ejector 8 has a pin elevation mechanism for ascending or descending an ejector pin (omitted from the drawings) for pushing up chips. When the chips 6 are picked up from the wafer ring 5 by means of a mount head to be described later, the chips 6 are pushed up from below the wafer ring 5 by means of the ejector pin, whereupon the chips 6 are exfoliated from the sheet stretched on the wafer ring 5. The ejector 8 acts as a sheet exfoliation mechanism for exfoliating the chips 6 from the sheet stretched on the wafer ring 5.

The sheet exfoliation mechanism is not limited to the ejector 8 provided herein, but any mechanism capable of exfoliating chips from a sheet is sufficient. For instance, a mechanism that sucks from below a sheet from which chips have been exfoliated, thereby exfoliating the chips from the sheet by means of suction force.

As shown in FIGS. 1 and 3, a substrate hold portion 10 is disposed at a position separated in a direction Y from the component supply portion 2 on an upper surface of the base 1. A substrate carry-in conveyor 12, a substrate sorting portion 13A, the substrate hold portion 10, a substrate delivery portion 13B, and a substrate carry-out conveyor 14 are arranged in series and in a direction X on upstream and downstream sides of the substrate hold portion 10, respectively. The substrate carry-in conveyor 12 is disposed so as to straddle a sub-base 1$a$ linked to the base 1, and an adhesive applicator 9 is disposed on the sub-base 1$a$. The adhesive applicator 9 applies, by means of an application head 9$a$, an adhesive for bonding chips to the substrate 11 carried in on the substrate carry-in conveyor 12 from the upstream side. The substrate 11 is a multiple substrate in which a plurality of unit substrates 11$a$ are fabricated into a single piece (see FIGS. 10A to 10C), and three chips 6 of different types (a chip 6A, a chip 6B, and a chip 6C) are implemented on each of the unit substrates 11$a$.

The substrates 11 applied with an adhesive are passed to the substrate sorting portion 13A, and the substrate sorting portion 13A selectively sorts the thus-passed substrates 11 to two substrate hold mechanisms of the substrate hold portion 10 that will be described later. The substrate hold portion 10 is in the form of a plurality of lanes having a first substrate hold mechanism 10A and a second substrate hold mechanism 10B; individually positions the two substrates sorted by the substrate sorting portion 13A; and holds the thus-sorted substrates. The substrate delivery portion 13B selectively receives only the packaged substrates 11 from the first substrate hold mechanism 10A and the second substrate hold mechanism 10B and passes the thus-received substrates to the substrate carry-out conveyor 14. The substrate carry-out conveyor 14 carries only the thus-received, packaged substrates 11 out in the downstream direction. Specifically, the substrate carry-in conveyor 12, the substrate sorting portion 13A, the substrate delivery portion 13B, and the substrate carry-out conveyor 14 constitute a substrate conveyance mechanism that sequentially carries a plurality of substrates into the substrate hold portion 10 and carries the packaged substrates 11 out of the substrate hold portion 10.

As shown in FIG. 3, the first substrate hold mechanism 10A has a substrate sensor SA, and the second substrate hold mechanism 10B has a substrate sensor SB. Each of the first substrate hold mechanism 10A and the second substrate hold mechanism 10B can individually detect whether or not the substrates 11 sorted by the substrate sorting portion 13A is properly positioned at a normal mount position and can undergo component mount operation.

The wafer supply portion 17 is disposed at a position that is on the opposite side of the substrate hold portion 10 and separate, in the direction Y, from the component supply portion 2 on the upper surface of the base 1. The wafer supply portion 17 has a magazine hold portion 17$a$ and a lifter mechanism 18 that ascends or descends a magazine within the magazine hold portion 17$a$. The magazine hold portion 17$a$ holds and ascends/descends a magazine housing, in a stacked manner, the wafer rings 5A, 5B, and 5C respectively having a plurality of types of chips 6A, 6B, and 6C.

The lifter mechanism 18 ascends or descends the magazine, so that the magazine can be positioned at a conveyance level for replacing any one of the wafer rings 5A, 5B, and 5C with the component supply portion 2, as shown in FIG. 2. Any of the wafer rings 5A, 5B, and 5C positioned at the conveyance level is pushed rightwardly by a pushing mechanism 19 and conveyed to the component supply portion 2 in a state of being gripped by a chuck portion 49$a$ of a jig replacement mechanism 49 to be described later. Specifically, the component supply portion 2 supplies a plurality of types of electronic components. When the component supply portion 2 becomes vacant as a result of taking out of all of the chips 6 or when the type of components to be mounted is switched, the jig replacement mechanism 49 performs wafer replacement operation; namely, loading and unloading of the wafer ring 5 between the component supply portion 2 and the wafer supply portion 17.

In FIG. 1, a first Y-axis base 20A and a second Y-axis base 20B are disposed at both ends of the upper surface of the base 1 with longitudinal directions of the bases being oriented in the direction Y (a first direction) orthogonal to a direction of conveyance of a substrate (the direction X). First direction guides 21 are positioned on an upper surface of the first Y-axis base 20A and an upper surface of the second Y-axis base 20B over the entire length of the longitudinal direction (the direction Y). The pair of first direction guides 21 are arranged in parallel such that the component supply portion 2 and the substrate hold portion 10 are interposed therebetween.

A first beam member 31, a center beam member 30, and a second beam member 32, which are of a center support type and whose both ends are supported by the first direction guide 21, are provided so as to span over the pair of first direction guides 21 and to be respectively slidable in the direction Y. A nut member 23$b$ is projectingly provided at a right-side end of the center beam member 30. A feed screw 23$a$ screw-engaged with the nut member 23$b$ is rotationally driven by a Y-axis motor 22 horizontally disposed on the first Y-axis base 20A. The center beam member 30 is horizontally moved in the direction Y along the first direction guide 21 by driving the Y-axis motor 22.

A nut member 25$b$ is projectingly provided at a left-side end of the first beam member 31, and a nut member 27$b$ is projectingly provided at a left-side end of the second beam member 32. A feed screw 25$a$ screw-engaged with the nut member 25$b$ is rotationally driven by a Y-axis motor 24 horizontally provided on the second Y-axis base 20B, and a feed screw 27$a$ screw-engaged with the nut member 27$b$ is rotationally driven by a Y-axis motor 26 horizontally provided on the second Y-axis base 20B. The first beam member 31 and the second beam member 32 are horizontally moved in the direction Y along the first direction guide 21 by means of driving the Y-axis motors 24 and 26.

The center beam member 30 is equipped with a single mount head 33, and a feed screw 41$a$ screw-engaged with the nut member 41$b$ coupled to the mount head 33 is rotationally driven by an X-axis motor 40. As a result of the X-axis motor 40 being driven, the mount head 33 is moved in the direction X by being guided by a second direction guide 42 (see FIG. 2) provided on the side surface of the center beam 30 in the direction X (the second direction).

The mount head 33 is removably equipped with a plurality of (four in the embodiment) nozzles 33a that each hold a single chip 6 by means of suction and can collectively take out a plurality of chips 6 of the same type by means of component mount operation and move while holding the chips 6 by means of the respective nozzles 33a. The mount head 33 is horizontally moved in the directions X and Y by driving the Y-axis motor 22 and the X-axis motor 40, to thus pickup and hold the chips 6 of the component supply portion 2 and convey and load the thus-held chips 6 to component mount positions 11b on the plurality of substrates 11 held by the first substrate hold mechanism 10A and the second substrate hold mechanism 10B of the substrate hold portion 10.

There may also be adopted a configuration that is separately provided with a mechanism for picking up a chip and in which a mount head receives the chip from the pickup mechanism and holds the chip. Moreover, it is desirable to provide the pickup mechanism with a chip inversion mechanism, insomuch as the mechanism can also perform flip-chip mounting in which a chip is mounted on a substrate with being upside down.

As shown in FIGS. 2 and 3, a third camera 15 is interposed between the component supply portion 2 and the substrate hold portion 10. The mount head 33 picked up the chips 6 from the component supply portion 2 moves over the third camera 15 in the direction X, whereby the third camera 15 captures images of the chips 6 held on the mount head 33. Further, a nozzle replacement mechanism 16 is interposed between the substrate hold portion 10 and the component supply portion 2 so as to adjoin the third camera 15. The nozzle replacement mechanism 16 houses and holds nozzles 33a to be added to the mount head 33 in numbers and types conforming to respective chips 6 of a plurality of types. The mount head 33 accesses the nozzle replacement mechanism 16, to thus perform nozzle replacement operation. Thereby, the nozzle 33a already attached to the mount head 33 can be replaced with another nozzle 33a conforming to electronic components that are new objects to be mounted.

The pair of first direction guides 21, the center beam member 30, the first direction drive mechanism (the Y-axis motor 22, the feed screw 23a, and the nut member 23b) for moving the center beam member 30 along the first direction guide 21, and the second direction drive mechanism (the X-axis motor 40, the feed screw 41a, and the nut member 41b) for moving the mount head 33 along the second direction guide 42 constitute a head movement mechanism for moving the mount head 33 between the component supply portion 2 and the substrate hold portion 10.

The first beam member 31 is equipped with a first camera 34, and a nut member 44b is joined to a bracket 34a that retains the first camera 34. A feed screw 44a screw-engaged with a nut member 44b is rotationally driven by an X-axis motor 43, and the first camera 34 is moved, as a result of driving of the X-axis motor 43, in the direction X by being guided by the second direction guide 45 (see FIG. 2) provided on the side surface of the first beam member 31.

The first camera 34 is horizontally moved in the directions X and Y by driving the Y-axis motor 24 and the X-axis motor 43. As a result, the first camera 34 can perform movement over the substrate hold portion 10 for capturing images of the substrates 11 held by the first substrate hold mechanism 10A and the second substrate hold mechanism 10B of the substrate hold portion 10 and movement for receding from the position above the substrate hold portion 10.

The pair of first direction guides 21, the first beam member 31, the first direction drive mechanism (a Y-axis motor 24, a feed screw 25a, and a nut member 25b) for moving the first beam member 31 along the first direction guide 21, and a second direction drive, mechanism (an X-axis motor 43, a feed screw 44a, and a nut member 44b) for moving the first camera 34 along a second guide 45 constitute a first camera movement mechanism for moving the first camera 34 over the substrate hold portion 10.

A second beam member 32 (a movement beam) is equipped with a second camera 35, and a nut member 47b is joined to a bracket 35a that holds the second camera 35. A feed screw 47a screw-engaged with the nut member 47b is rotationally driven by an X-axis motor 46, and the second camera 35 is moved, as a result of driving of the X-axis motor 46, in the direction X by being guided by a second direction guide 48 (see FIG. 2) provided on a side surface of the second beam member 32.

The second camera 35 is horizontally moved in both the directions X and Y by driving the Y-axis motor 26 and the X-axis motor 46. As a result, the second camera 35 can perform movement over the component supply portion 2 for capturing images of the chips 6 held by the component supply portion 2 and movement for receding from a position above the component supply portion 2.

The pair of first direction guides 21, the second beam member 32, the first direction drive mechanism (a Y-axis motor 26, a feed screw 27a, and a nut member 27b) for moving the second beam member 32 along the first direction guide 21, and a second direction drive mechanism (the X-axis motor 46, the feed screw 47a, and the nut member 47b) for moving the second camera 35 along a second guide 48 constitute a component imaging camera movement mechanism for moving the second camera 35 serving as a component imaging camera. Therefore, the second beam member 32 is moved in the first direction over the component supply portion 2 by means of the component imaging camera movement mechanism.

The jig replacement mechanism 49 is attached to an opposite side of the side surface of the second beam member 32 equipped with the second camera 35. The jig replacement mechanism 49 is made up of a chuck portion 49a having a chuck claw for pinching and gripping one end of the wafer ring 5 and a chuck elevation mechanism 49b for ascending and descending the chuck portion 49a. The chuck claw is driven to open and close by a chuck claw open/close mechanism 49c (see FIG. 4).

The second beam member 32 is driven, to thus move the jig replacement mechanism 49 to the end of the wafer ring 5, so that the wafer ring 5 can be gripped by the chuck portion 49a. In this state, the second beam 32 is driven, thereby enabling the jig replacement mechanism 49 to grip and move the wafer ring 5 in the direction Y. Thereby, during the course of iteration of component mount operation, wafer replacement operation for replacing the wafer ring 5 of the component supply portion 2 with a wafer ring 5 housed in the wafer supply portion 17 can be performed in conformance to the type of components to be mounted.

The configuration of a control system of the electronic component mounting apparatus will now be described by reference to FIG. 4. The mechanism drive portion 50 is made up of a motor driver for electrically driving motors of respective mechanisms provided below and control equipment for controlling pneumatic pressure supplied to air cylinders of the respective mechanisms. Respective drive elements are driven by controlling the mechanism drive portion 50 by means of a control portion 54.

The X-axis motor 40 and the Y-axis motor 22 drive a mount head movement mechanism that moves the mount head 33. The X-axis motor 43 and the Y-axis motor 24 drives the first camera movement mechanism that moves the first camera 34, and the X-axis motor 46 and the Y-axis motor 26 drive the second camera movement mechanism that moves the second camera 35.

The mechanism drive portion 50 drives the elevation mechanism for the mount head 33, a component suction mechanism formed from the nozzle 33a (see FIG. 2), and the nozzle replacement mechanism 16, as well as driving a drive motor for an elevation cylinder of the ejector 8 and the ejector XY table 7. Further, the mechanism drive portion 50 drives the substrate carry-in conveyor 12, the substrate carry-out conveyor 14, the substrate sorting portion 13A, the substrate delivery portion 13B, the first substrate hold mechanism 10A, the second substrate hold mechanism 10B, and the chuck portion elevation mechanism 49b and the chuck claw open/close mechanism 49c of the jig replacement mechanism 49. A detection signal from the substrate sensor SA provided in the first substrate hold mechanism 10A and a detection signal from the substrate sensor SB provided in the second substrate hold mechanism 10B are taken into the control portion 54 (an illustration of a path along which the detection signals are taken is omitted).

The mount enable/disable determination portion 54a determines, on the basis of the substrate detection signals from the substrate sensors SA and SB, whether or not mount operation targeted for the substrates is feasible. Consequently, the substrate sensors SA, SB and the mount enable/disable determination portion 54a act as mount enable/disable determination device that determines whether or not to be able to perform component mount operation targeted for the substrates by individually detecting the states of the substrates 11 in the substrate hold portion 10. In the present embodiment, as will be described later, the control portion 54 controls the previously-described respective portions on the basis of a result of determination rendered by the mount enable/disable determination device in the course of component mounting operation targeted for the two substrates 11 held by the substrate hold portion 10, thereby controlling component mounting operation that the mount head 33 performs while taking the two substrates 11 as targets.

Specifically, in the above configuration, the control portion 54 controls the substrate hold portion 10, the substrate conveyance mechanism, the head movement mechanism, and the nozzle replacement mechanism on the basis of results of the determination rendered by the mount enable/disable determination device. Thereby, the control portion acts as mount control device which causes the mount head 33 to perform component mount operation for sequentially mounting chips of a plurality of types on the plurality of substrates 11 that are held by the substrate hold portion 10 and have come to be able to undergo component mounting operation while replacing the nozzle 33a in conformance to the type of an electronic component to be mounted.

A first recognition processing portion 55 processes an image captured by the first camera 34, to thus determine the component mount position 11b (see FIGS. 10A to 10C) on the substrate 11 held by the substrate hold portion 10. The component mount position 11b shows the mount position of the chip 6 on the substrate 11 and enables detection of a position by means of image recognition. The second recognition processing portion 56 serving as a component recognition processing portion processes an image captured by the second camera 35, thereby determining the position of the chip 6 of the component supply portion 2. A third recognition processing portion 57 processes an image captured by the third camera 15, thereby determining the position of the chips 6 held by the mount head 33.

Results of recognition performed by the first recognition processing portion 55, the second recognition processing portion 56, and the third recognition processing portion 57 are sent to the control portion 54. The data storage portion 53 stores various pieces of data, such as packaging data and component data. An operation portion 51 is an input device, such as a keyboard and a mouse, and performs entry of data and a control command. A display portion 52 displays a captured image screen produced by the first camera 34, the second camera 35, and the third camera 15, as well as displaying a guide screen at the time of entry performed by way of the operation portion 51.

Figure 5A:
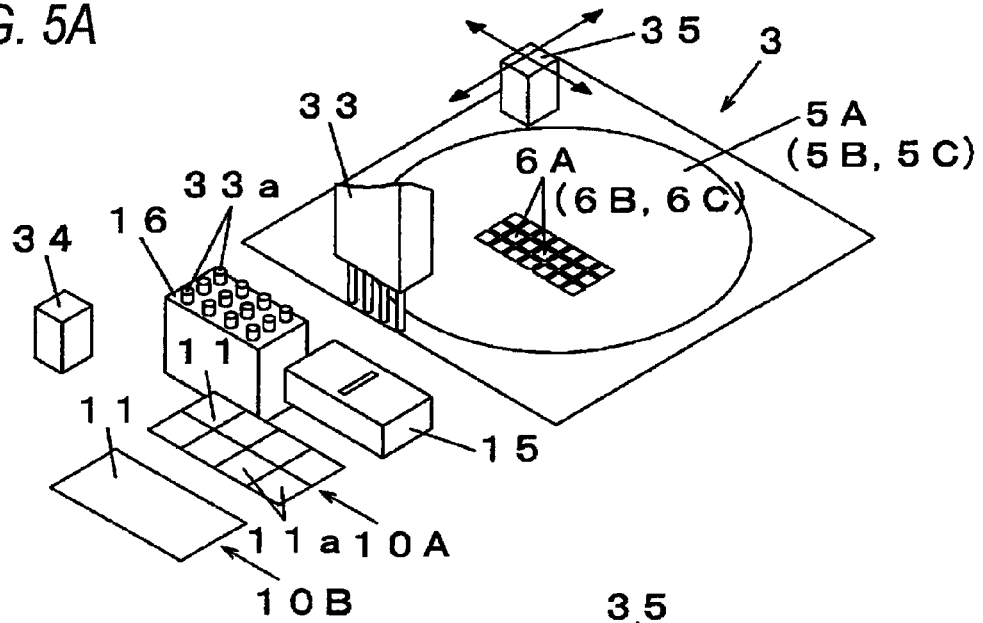
FIGS. 5A and 5B are explanatory views of operation of the electronic component mounting apparatus of the embodiment of the present invention.
Figure 5B:
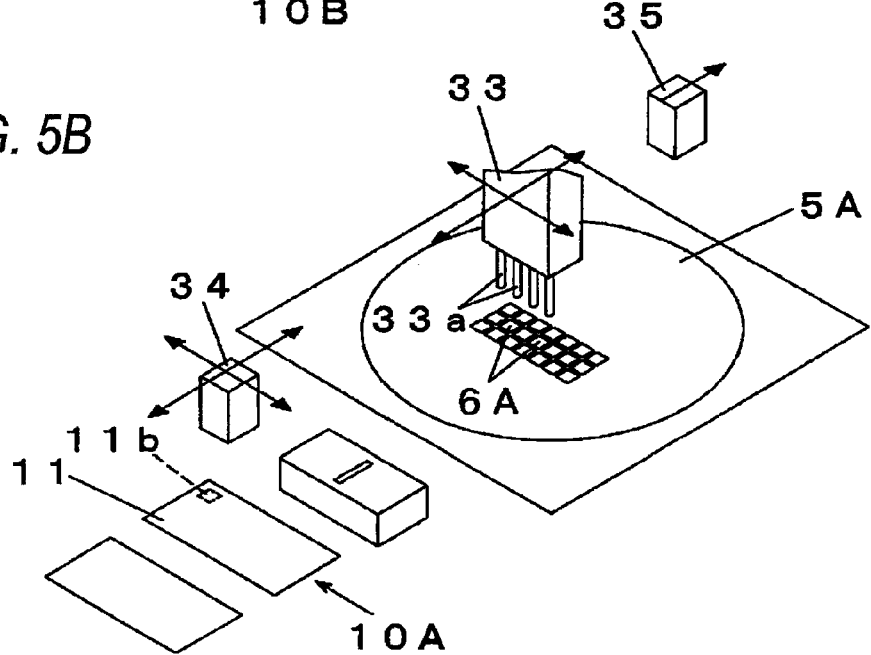

The electronic component mounting apparatus is configured as mentioned above, and operation of the electronic component mounting apparatus will be described hereunder by reference to FIGS. 5A, 5B, 6A, 6B, 7A, 7B and 8. In FIGS. 5A and 5B, a plurality of chips 6A (or 6B or 6C) are affixed to the wafer ring 5A (or 5B or 5C) held by the wafer hold table 3 of the component supply portion 2. In the following descriptions, only the wafer ring 5A and the chip 6A are illustrated. In the substrate hold portion 10, the substrates 11 are held in the first substrate hold mechanism 10A and the second substrate hold mechanism 10B, respectively. By means of electronic component mounting operation provided herein, the plurality of chips 6A are sequentially sucked and held by four nozzles 33a provided in the mount head 33, and the four chips 6A are sequentially mounted at components mount positions 11b of the respective unit substrates 11a.

First, as shown in FIG. 5A, the second camera 35 is moved to a position above the component supply portion 2 by means of the second camera movement mechanism, and a plurality of (four) chips 6A that are about to be picked up are photographed by the second camera 35. Subsequently, as shown in FIG. 5B, the second camera 35 is caused to recede from the position above the chips 6. The second recognition processing portion 56 subjects the image captured by the second camera 35 to recognition processing, thereby determining positions of the plurality of chips 6.

The mount head 33 is moved to a position above the component supply portion 2. On the basis of the thus-determined positions of the plurality of chips 6, the mount head movement mechanism is caused to perform positioning operation for sequentially positioning the mount head 33 to the chips 6, thereby sequentially picking up the plurality of chips 6 by means of four nozzles 33a of the mount head 33.

Simultaneously with pick-up operation, the first camera movement mechanism moves the first camera 34 over the substrate 11 held by the first substrate hold mechanism 10A of the substrate hold portion 10. The first camera 34 is sequentially moved while four left-side component mount positions 11b of the component mount positions set on the substrate 11 are taken as targets whose images are to be captured, and images of the plurality of component mount positions 11b are captured, and the first camera 34 is subsequently caused to recede from the position above the substrate 11.

Figure 6A:
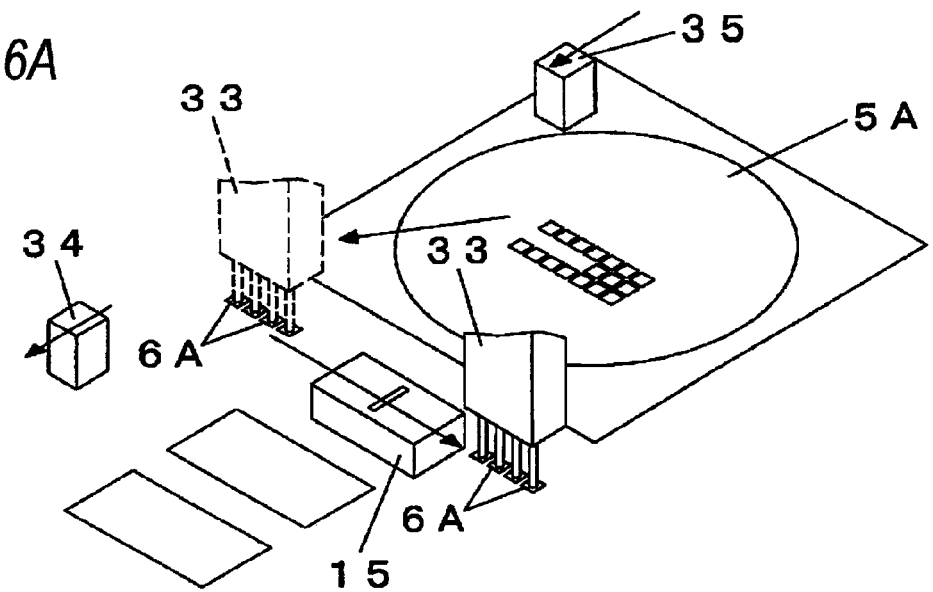
FIGS. 6A and 6B are explanatory views of operation of the electronic component mounting apparatus of the embodiment of the present invention.

The images captured by the first camera 34 are processed by the first recognition processing portion 55, thereby determining the component mount positions 11b on the substrate 11. Subsequently, as shown in FIG. 6A, the mount head 33 holding four chips on each of the nozzles 33a performs scan operation for moving the mount head 33 over the third camera 15. Thereby, images of the chips 6 held by the respective nozzles 33a are captured by the third camera, and the third recognition processing portion 57 subjects the images to recognition processing, thereby detecting the positions of the chips 6.

Figure 6B:
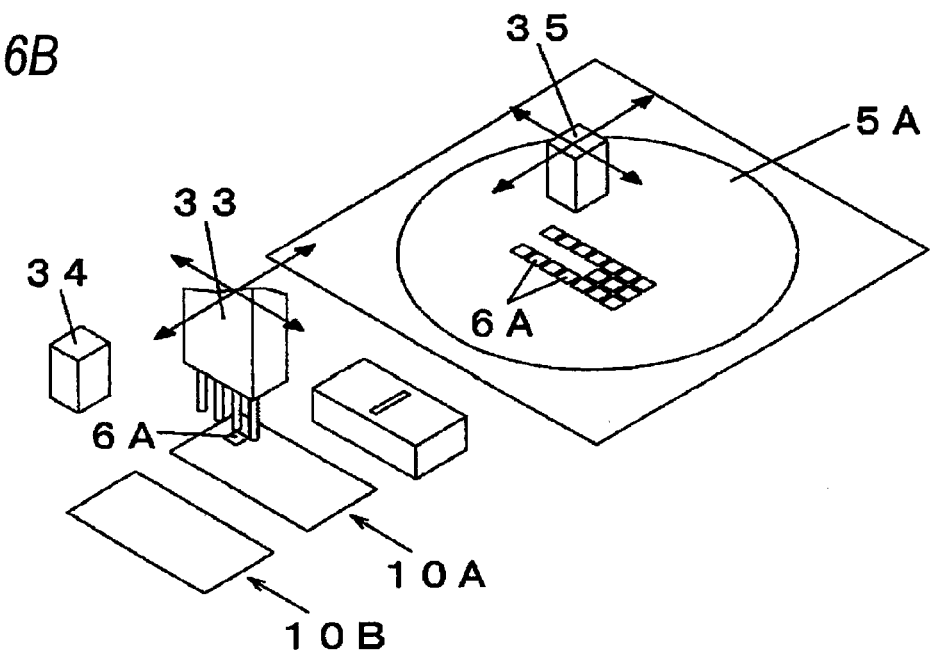

Processing then proceeds to component mount operation. As shown in FIG. 6B, the mount head 33 moves to a position above the substrate hold portion 10. Component mount operation for sequentially mounting the chips 6 held by the mount head 33 to the substrates 11 held by the substrate hold portion 10 is performed while the mount head 33 is moved by the mount head movement mechanism on the basis of the component mount position 11b determined by the first recognition processing portion 55 and the positions of the chips 6 determined by the third recognition processing portion 57.

In the middle of the chips 6 being mounted by the mount head 33, the second camera 35 is moved to the positions above the plurality of chips 6 to be picked up next by the component supply portion 2, thereby photographing the plurality of chips 6 by means of the second camera 35. Subsequently, processing pertaining to steps analogous to those mentioned above is iteratively carried out, thereby performing operation for replacing the wafer ring 5 held by the component supply portion 2 in the middle of processing pertaining to the respective steps being performed.

Figure 7A:
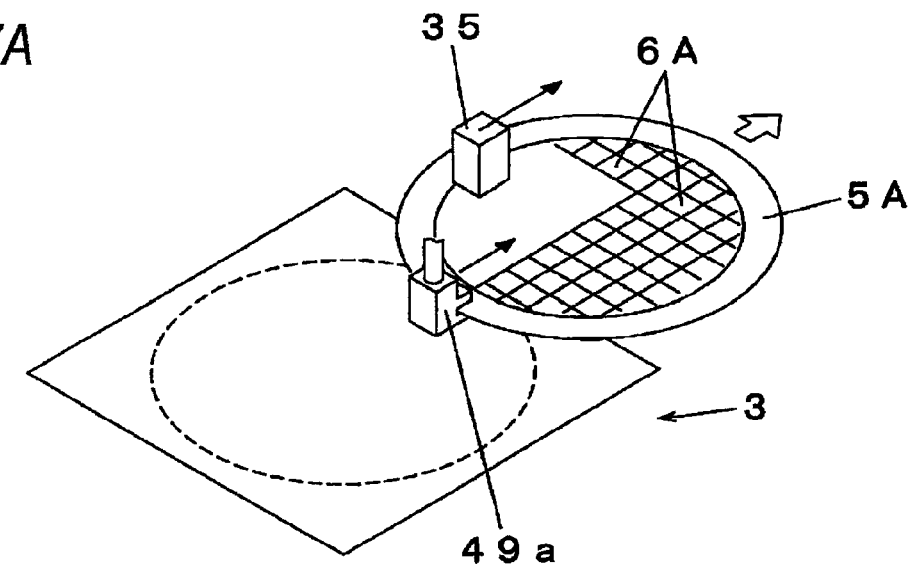
FIGS. 7A and 7B are explanatory views of operation of the electronic component mounting apparatus of the embodiment of the present invention.

Specifically, when the type of chips to be mounted is switched and when the wafer ring 5 held by the component supply portion 2 must be replaced with a wafer ring holding chips of another type, the already-attached wafer ring 5 is gripped by means of the chuck portion 49a of the jig replacement mechanism 49 as shown in FIG. 7A. The second beam member 32 is driven, and the jig replacement mechanism 49 is moved along with the second camera 35, whereby the wafer ring 5 is carried out of the component supply portion 2 to the wafer supply portion 17 (FIGS. 1 and 2).

Figure 7B:
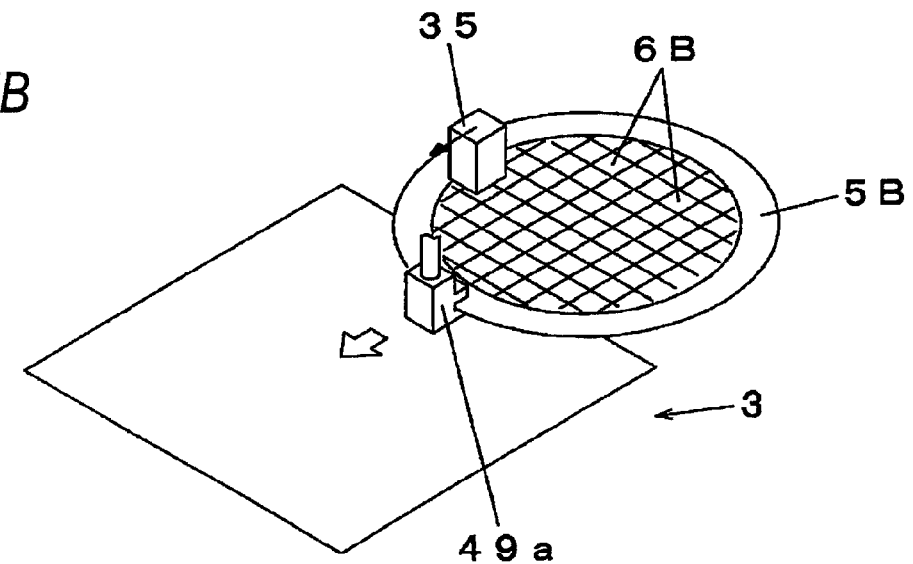

The wafer supply portion 17 houses the wafer ring 5 into the magazine and grips, by means of the jig replacement mechanism 49, a wafer ring 5 having chips that are to be newly mounted. Subsequently, the second beam member 32 is driven to move the jig replacement mechanism 49 toward the component supply portion 2 along with the second camera 35, as shown in FIG. 7B, thereby causing the wafer hold table 3 to hold the wafer ring 5.

When chips to be mounted are switched, nozzle replacement operation is performed together with the previously-described wafer replacement operation. As shown in FIG. 8, the mount head 33 is moved to a position above the nozzle replacement mechanism 16, where the mount head 33 is lifted or lowered with respect to the nozzle replacement mechanism 16, thereby actuating nozzle-shaped steel provided in the nozzle replacement mechanism 16. Thereby, when the nozzles 33a already attached to the mount head 33 are returned to the nozzle replacement mechanism 16, and the nozzles 33a assigned to chips that are the next targets of mounting are attached to the mount head 33.

An electronic component mounting method for the electronic component mounting apparatus illustrated in the present embodiment will now be described by reference to a timing chart of FIG. 9, and FIGS. 10A to 10C, 11A to 11C, and 12A to 12C. FIG. 9 shows the sequence of component mount operation for each of component types A, B, and C performed by the first lane (the first substrate hold mechanism 10A) and the second lane (the second substrate hold mechanism 10B) in connection with the plurality of substrates 11 sequentially carried into the substrate hold portion 10 by means of the substrate sorting portion 13A, in association with working operation performed along with switching of a component type, such as replacement of a wafer/replacement of a nozzle.

M1, M2, M3, . . . designate substrate mount processes determined by summarizing, on a per-substrate basis, the component mount operations performed by the substrate hold portion 10, and appended indices correspond to serial numbers imparted to the substrates 11 in the sequence in which the substrates are carried in the substrate hold portion 10 from the substrate sorting portion 13A. Specifically, the substrate mount process M1 is a substrate mount process preceding to the substrate mount process M2, and the substrate mount process M2 is a substrate mount process subsequent to the substrate mount process M1. Even in a substrate mount process targeted for substrates 11 carried in after that, a similar relationship stands between two substrates 11, one of which immediately precedes the other and the other of which follows close behind the one.

Figure 10A:
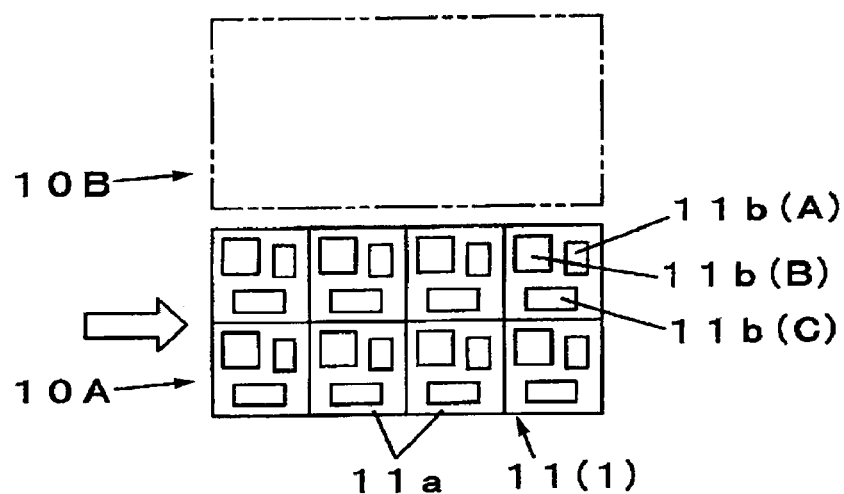
FIGS. 10A to 10C are explanatory views of processes of the electronic component mounting method of the embodiment of the present invention.

First, as shown in FIG. 10A, a first substrate 11(1) is carried in the first lane (the first substrate hold mechanism 10A) and positioned at a mount position, whereupon the substrate sensor SA detects the positioned state. The mount enable/disable determination portion 54a determines whether or not the substrate 11(1) can be subjected to initiation of mount operation. Thereby, the mount head 33 sequentially mounts the chips 6A, 6B, and 6C at component mount positions 11b of the respective unit substrates 11a constituting the substrate 11; namely, component mount positions 11b(A), 11b(B), and 11b(C) corresponding to the respective three component types A, B, and C in the embodiment.

Figure 10B:
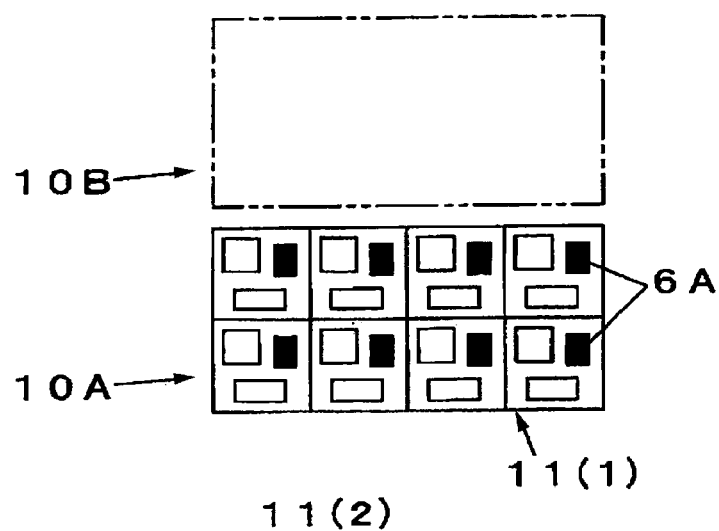

Next, processing pertaining to the first substrate mount process M1 is initiated, and mount operation is performed for each of component types along a preset component mount sequence A-B-C. First, component mount operation targeted for the component type A is performed. The mount head 33 collectively picked up chips 6A of a single type from the component supply portion 2 sequentially mounts the chips 6A to the component mount position 11b(A) on each of the unit substrates 11a of the substrate 11(1), as shown in FIG. 10B.

Figure 10C:
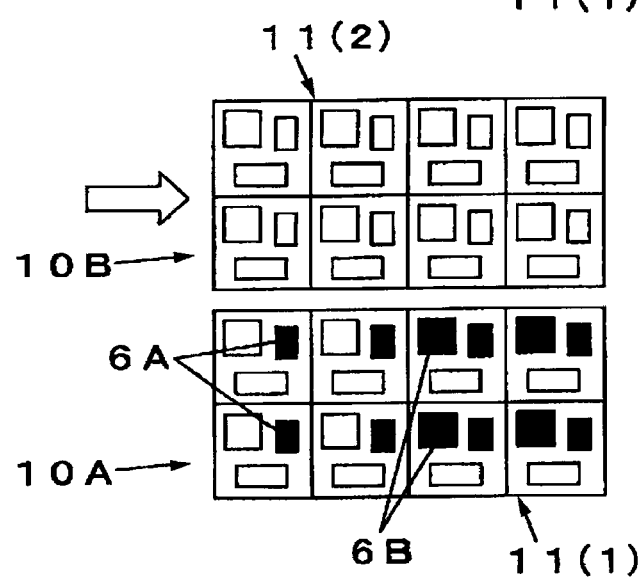

When mount operation is completed, component switching operation for switching a component type from type A to type B is performed as shown in FIG. 9, and component mount operation targeted for a component type B is performed. Specifically, as shown in FIG. 10C, the chips 6B are sequentially mounted to the component mount positions 11b (B) of respective unit substrates 11a of the substrate 11(1). In parallel with component mount operation performed by the first substrate hold mechanism 10A, the second substrate 11(2) is carried into the second substrate hold mechanism 10B. When positioning of the substrate to the mount position is completed, the substrate sensor SB detects the state, and the mount enable/disable determination portion 54a determines whether or not the substrate 11(1) can be subjected to component mount operation.

Figure 11A:
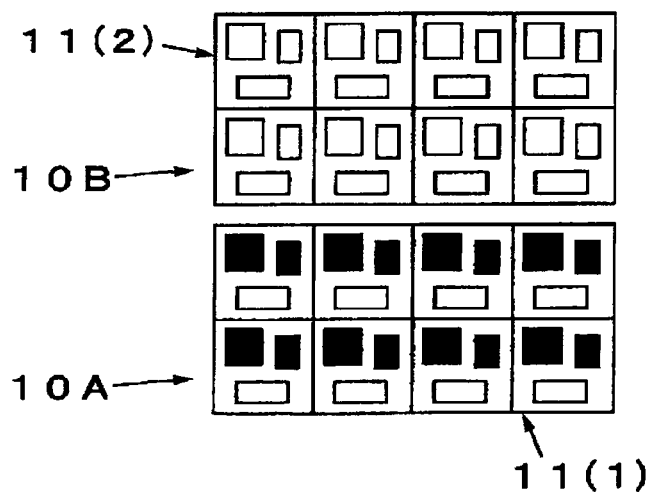
FIGS. 11A to 11C are explanatory views of processes of the electronic component mounting method of the embodiment of the present invention.
Figure 11B:
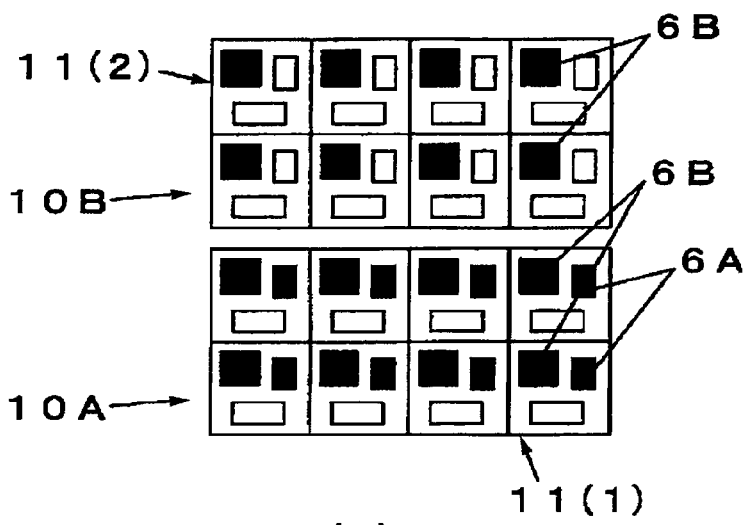

As shown in FIG. 11A, so long as a substrate 11(2) of the second substrate hold mechanism 10B can undergo component mount operation at a timing when component mount operation for mounting the chips 6A to the substrate 11(1) is completed, processing pertaining to the second substrate mount process M2 is initiated while the component type B is taken as a mount start component. Specifically, the mount head 33 continually shifts to component mount operation for the substrate 11(2) of the second substrate hold mechanism 10B while taking the component type B as a target. The second camera 35 photographs the chips 6B, and the second recognition processing portion 56 subjects the photograph to recognition processing. After having been picked up by the nozzles 33a, the chips 6B are sequentially mounted to the component mount positions 11b(B) of the respective unit substrates 11a of the substrate 11(2), as shown in FIG. 11B.

Figure 11C:
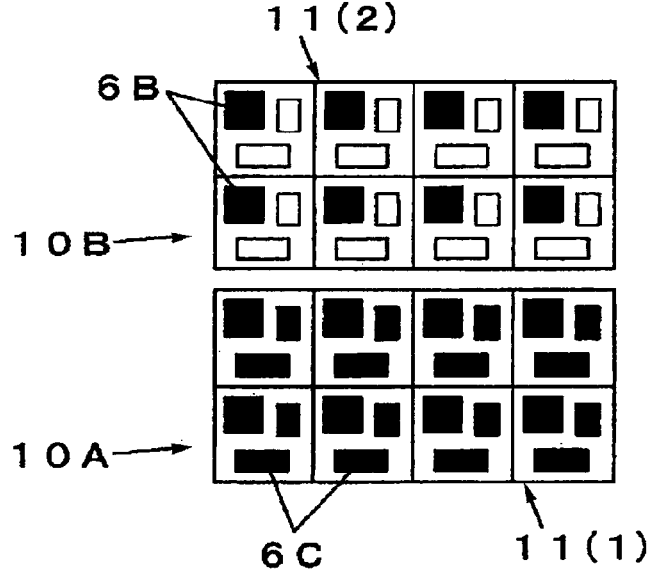

After completion of mount operation, component switching operation is performed for switching the component type from type B to type C as shown in FIG. 9, and mount operation targeted for the component type C is performed. Specifically, as shown in FIG. 11C, processing pertaining to the component mount process is continually carried out on the substrate 11(1) that has not yet finished undergoing component mount operation, whereupon the chips 6C are sequentially mounted at the component mount positions 11b(C) of the respective unit substrates 11a. As a result of completion of mounting of the chips 6C, the first substrate mount operation M1 targeted for the substrate 11(1) is completed. Subsequently, as shown in FIG. 12A, the substrate 11(1) is carried outside the first substrate hold mechanism 10A, and a new substrate 11(3) is carried into the first substrate hold mechanism 10A and positioned to a mount position for the next mount operation.

Figure 12A:
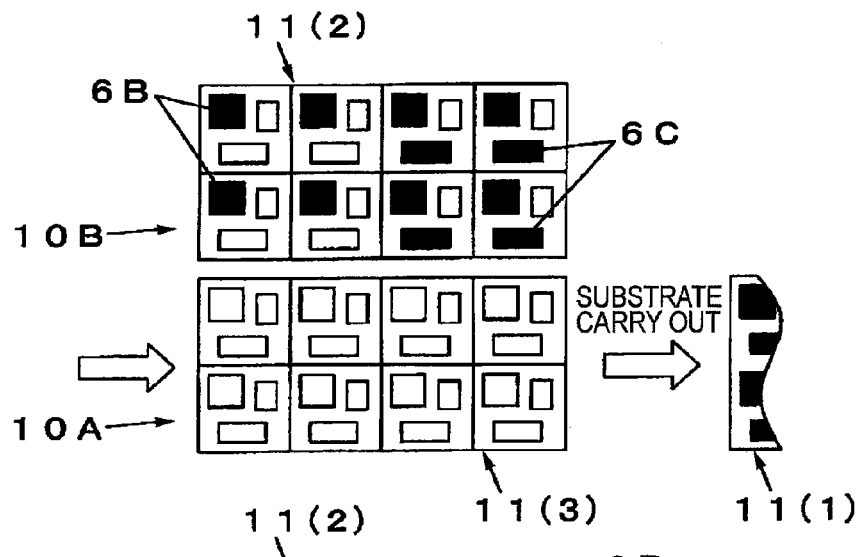
FIGS. 12A to 12C are explanatory views of processes of the electronic component mounting method of the embodiment of the present invention.
Figure 12B:
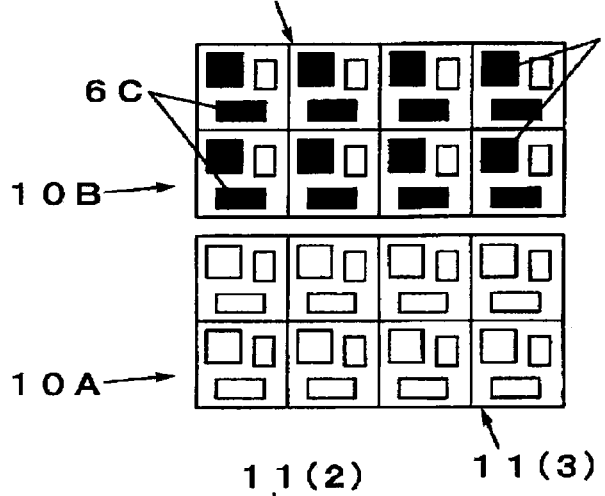
Figure 12C:
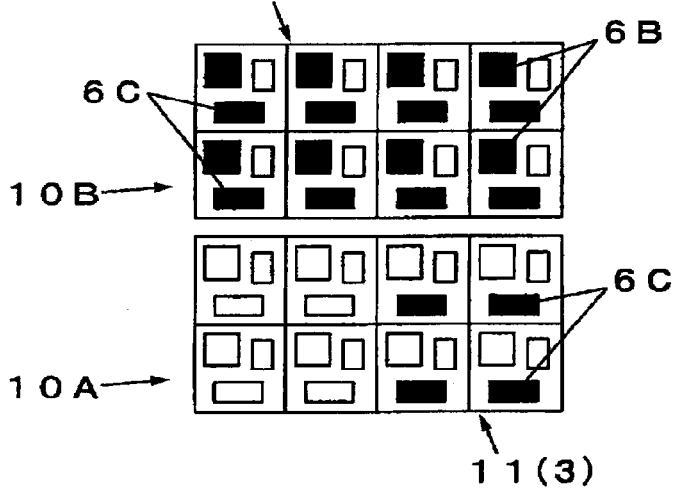

In parallel with substrate replacement-positioning operation performed by the first substrate hold mechanism 10A, the second substrate hold mechanism 10B sequentially mounts the chips 6C to the component mount positions 11b(C) of the respective unit substrates 11a of the substrate 11(2), as shown in FIG. 12A. As shown in FIG. 12B, so long as the substrate 11(3) of the first substrate hold mechanism 10A is already able to undergo component mount operation at a timing when mount operation for mounting chips 6C to the substrate 11(2) is completed, the mount head 33 continually shifts to component mount operation for the substrate 11(3) of the first substrate hold mechanism 10A targeted for the component type C. Specifically, as shown in FIG. 12C, the chips 6C are sequentially mounted to the component mount positions 11b(C) of the respective unit substrates 11a of the substrate 11(3).

Subsequently, as shown in FIG. 9, component switching operation for switching the component type from type C to type A is performed, and component mount operation targeted to the component type A is continually performed in connection with the substrates 11(2), 11(3), and 11(4). Later, similar component mount operation is cyclically, iteratively carried out on the component types A, B, and C.

Specifically, under foregoing electronic component mount method, when, among the plurality of substrates 11, a subsequent substrate carried in the substrate hold portion 10 subsequently to the preceding substrate has come to be able to undergo component mount operation before completion of processing pertaining to a preceding substrate mount process in which component mount operation is carried out on, among the plurality of substrates 11, a preceding substrate previously carried into the substrate hold portion 10, chips 6 that are already targets of component mount operation for the preceding substrate at this timing are taken as mount start components for the subsequent substrate by means of the control function of the control portion 54 serving as mount control device. Processing pertaining to the preceding substrate mount process targeted for the preceding substrate that has not yet finished undergoing mount operation is continually carried out. After processing pertaining to the preceding substrate mount process targeted for chips of a specific type is completed, processing pertaining to a subsequent substrate mount process targeted for the subsequent substrate is initiated.

Thereby, when compared with the related-art method for mounting a plurality of types of chips to a single substrate while component type switching operation is iterated for each substrate 11 each time, frequency of operation required with switching of a component type, such as replacement of a nozzle or a wafer, can be significantly reduced. Thereby, interruption of component mount operation is reduced to a minimum, thereby enhancing productivity. In particular, as in the case exemplified by the present embodiment, when loading and unloading of wafers on and from the magazine are required at the time of switching of a component type, to thus require consumption of time for component type switching operation, a particularly-noticeable advantage is yielded.

In the present embodiment, the wafer ring holding semiconductor chips in a wafer state serves as a component hold jig that holds electronic components two-dimensionally arranged in numbers. However, the form of the component hold jig is not limited to the wafer ring over which a wafer sheet is extended, and any jig, such as a tray on which electronic components are arranged side by side, comes to be an object of application of the present invention, so long as the jig accommodates electronic components in a two-dimensionally-arranged fashion.

Although the present invention has been described in detail or by reference to a specific embodiment, it is manifest to those skilled in the art that the present invention is susceptible to various alterations or modifications without departing from the spirit and scope of the present invention.

The present patent application is based on Japanese Patent Application, Application No. 2006-078447 filed on Mar. 22, 2006 in Japan, contents of which are incorporated herein for reference.

INDUSTRIAL APPLICABILITY

The electronic component mounting apparatus and the electronic component mounting method of the present invention yield an advantage of the ability to reduce the frequency of operation required with switching of a component type, such as replacement of a nozzle, thereby enhancing productivity, and are applicable to the field of electronic component mount intended for electronic components supplied in the state of a semiconductor wafer, such as a semiconductor chip.

The invention claimed is:

1. An electronic component mounting apparatus comprising:
   substrate hold portions for individually positioning and holding a plurality of substrates,
   a substrate conveyance mechanism for sequentially carrying the plurality of substrates into the substrate hold portions and sequentially carrying mounted substrates out of the substrate hold portions,
   a mount enable/disable determination device for determining whether or not component mount operation targeted for the substrates can be carried out by individually detecting states of the substrates in the substrate hold portion,
   a single mount head that takes electronic components out of a component supply portion that supplies a plurality of types of the electronic components, the single mount head conveying and mounting the electronic components on the plurality of substrates,
   a head movement mechanism for moving the single mount head between the component supply portion and the substrate hold portions,
   a nozzle removably attached to the single mount head,
   a nozzle replacement mechanism for attaching, in a replaceable manner, to the mount head the nozzle conforming to the respective electronic components of a plurality of types; and
   a mount control device that controls the substrate hold portions, the substrate conveyance mechanism, the head movement mechanism, and the nozzle replacement mechanism on the basis of a result of determination made by the mount enable/disable determination device, thereby carrying out component mount operation for causing the mount head to sequentially mount the plurality of types of the electronic components to the plurality of substrates that are held by the substrate hold portions and that have come to be able to undergo component mount operation while replacing the nozzle in conformance to a type of electronic components to be mounted, wherein, following a preceding substrate that has previously been carried in a first substrate hold portion, when a subsequent substrate carried in a second substrate hold portion has come to be able to undergo component mount operation before completion of the component mount operation of the preceding substrate, the mount control device starts a component mount operation of mounting on the subsequent substrate the type of electronic components among the plurality of types of the electronic components that are targets of the component mount operation for the preceding substrate as mount start components for the subsequent substrate.

2. The electronic component mounting apparatus according to claim 1, wherein a plurality of nozzles are attached to the mount head, and a plurality of electronic components of a single type are collectively taken out from the component supply portion during the component mount operation.

3. An electronic component mounting method for taking electronic components out of a component supply portion that supplies a plurality of types of electronic components, by a nozzle removably attached to a single mount head, and conveying and mounting the electronic components on a plurality of substrates held on substrate hold portions, the method comprising:

carrying out component mount operation for sequentially mounting, by the mount head, the plurality of types of electronic components to a plurality of substrates that are held by the substrate hold portions and that have come to be able to undergo component mount operation, while replacing the nozzle in conformance to a type of electronic components to be mounted, wherein, when, among the plurality of substrates, a subsequent substrate carried in a second substrate hold portion subsequently to the preceding substrate has come to be able to undergo component mount operation before completion of processing pertaining to a preceding substrate mount process in which component mount operation is carried out on, among the plurality of substrates, a preceding substrate previously carried into a first substrate hold portion, a mounting operation of the subsequent substrate is started while electronic components already serving as targets of component mount operation for the preceding substrate at the timing are recognized as mount start components for the subsequent substrate.

4. The electronic component mounting method according to claim 3, wherein a plurality of nozzles are attached to the mount head, and a plurality of electronic components of a single type are collectively taken out from the component supply portion during the component mount operation.

* * * * *